(12) United States Patent
Masuda et al.

(10) Patent No.: US 6,390,811 B1
(45) Date of Patent: May 21, 2002

(54) HIGH-TEMPERATURE AND HIGH-PRESSURE TREATMENT DEVICE

(75) Inventors: Tsuneharu Masuda; Takahiko Ishii; Yutaka Narukawa, all of Takasago (JP)

(73) Assignee: Kabushiki Kaisha Kobe Seiko Sho (Kobe Steel, Ltd.), Kobe (JP)

( * ) Notice: Subject to any disclaimer, the term of this patent is extended or adjusted under 35 U.S.C. 154(b) by 0 days.

(21) Appl. No.: 09/721,646

(22) Filed: Nov. 27, 2000

(30) Foreign Application Priority Data

Nov. 29, 1999 (JP) .......................................... 11-338193

(51) Int. Cl.⁷ ................................................ F27D 3/00
(52) U.S. Cl. ...................... 432/239; 432/125; 414/940; 219/402
(58) Field of Search .................... 432/5, 121, 125, 432/239, 241; 438/660, 663; 414/172, 939, 940; 219/390, 402; 392/416, 418

(56) References Cited

U.S. PATENT DOCUMENTS 5,180,273 A * 1/1993 Sakaya et al. ............... 414/173
5,447,294 A * 9/1995 Sakata et al. ................ 432/239
5,556,275 A * 9/1996 Sakata et al. ................ 432/241
5,567,152 A * 10/1996 Morimoto .................... 432/241

OTHER PUBLICATIONS

U.S. application No. 09/788,416, filed Feb. 21, 2001, pending.
U.S. application No. 09/721,646, filed Nov. 27, 2000, pending.
U.S. application No. 09/287,558, filed Apr. 6, 1999, pending.
U.S. application No. 09/496,058, filed Feb. 2, 2000, pending.
U.S. application No. 09/520,218, filed Mar. 7, 2000, pending.
U.S. application No. 09/527,520, filed Mar. 16, 2000, pending.

* cited by examiner

*Primary Examiner*—Gregory Wilson
(74) *Attorney, Agent, or Firm*—Oblon, Spivak, McClelland, Maier & Neustadt, P.C.

(57) ABSTRACT

To provide a high-temperature and high-pressure treatment device in which articles to be treated such as wafers of LSI semiconductors can be transported in a stable attitude, and the entire apparatus is made compact.

A high-temperature and high-pressure treatment device in which articles to be treated 16 are arranged within a pressure vessel 13, and said pressure vessel 3 is interiorly placed in an atmosphere of high-temperature and high-pressure gases to treat the articles be treated 16 under the high-temperature and high-pressure, the treatment device comprising: a module for carrying articles to be treated 21 for carrying the articles to be treated 16 in and out of a pressure vessel, and a press frame module 20 for holding the pressure vessel 3 in an axial direction of vessel when the articles to be treated 16 are subjected to high-temperature and high-pressure treatment in the pressure vessel 3 closed by top and bottom closures 2, 4, wherein the module for carrying articles to be treated 21 and the press frame module 20 are connected and fixed so that both the modules 20, 21 can be reciprocated integrally.

4 Claims, 8 Drawing Sheets

HIGH-TEMPERATURE AND HIGH-PRESSURE TREATMENT DEVICE

BACKGROUND OF THE INVENTION

1. Field of the Invention

The present invention relates to a high-temperature and high-pressure treatment device having a function of annealing articles to be treated such as LSI (Large Scale Integration) semiconductors (articles, particularly sheet articles), typically Si wafers, under an atmosphere of high-temperature and high-pressure gases within a pressure vessel, and a further function of sequentially carrying the articles to be treated in or out of the pressure vessel in order to continuously apply annealing to the articles to be treated.

2. Description of the Related Art

Those as shown in FIGS. 5 to 8 have been heretofore known as a high-temperature and high-pressure treatment device having a function of annealing articles to be treated such as LSI semiconductors (articles, particularly sheet articles) under an atmosphere of high-temperature and high-pressure gases within a pressure vessel, and sequentially carrying the articles to be treated in or out of the pressure vessel. FIG. 5 is a top view (a plan view) representative of the entire constitution of a conventional high-temperature and high-pressure treatment device, FIG. 6 is a view taken on arrow A in FIG. 5, FIG. 7 is a view taken on arrow B in FIG. 5, and FIG. 8 is a view taken on arrow C in FIG. 5. FIG. 6 omits to show a press frame module in addition to a press frame, and FIG. 8 omits to show a module for carrying articles to be treated in addition to a bottom closure elevating frame.

The high-temperature and high-pressure treatment devices shown in FIGS. 5 to 8 comprise a pressure vessel 3, a top closure 2, a bottom closure 4, a press frame 1 and the like which are directly participated in annealing. Articles to be treated are arranged within the pressure vessel 3, the top closure 2 and the bottom closure 4 are closed, the pressure vessel 3 is interiorly maintained at an atmosphere of high pressure gases mainly comprising an inert gas such as argon by high pressure gas generating means not shown, and the interior of the pressure vessel 3 is heated by a heating device 15 disposed interiorly of the pressure vessel 3. The article to be treated are exposed to the high-temperature and high-pressure gas atmosphere whereby filling and contactness of contact holes, pier holes, and grooves formed in a wiring film or the like on the articles to be treated can be enhanced.

Wafer-like articles to be treated are normally subjected to handling as a lot in a state that they are received into a cassette 16 and stacked in plural number. For continuously annealing a plurality of articles to be treated every lot, the high-temperature and high-pressure treatment devices shown in FIGS. 5 to 8 have a function of sequentially carrying articles to be treated (cassettes) 16 in or out of the pressure vessel 3. To this end, more specifically, there are provided a bottom closure moving frame 11, a bottom closure elevating frame 12, a bottom closure elevating device 13, and a bottom closure moving device 17.

Where the articles to be treated are carried in or out of the pressure vessel 3, first, the press frame 1 stood upright on a carriage 8 is moved in a horizontal direction along a rail member 10 on a base frame 7 in accordance with control of a carriage moving device 9 to secure a sufficient space below the pressure vessel 3. Subsequently, the bottom closure moving frame 11 is likewise moved in a horizontal direction along the rail member 10 on the base frame 7 by the bottom closure moving device 17 so that the bottom closure elevating frame 12 assumes a position of the space, that is, a position below the pressure vessel 3. Then, the bottom closure elevating frame 12 is moved upward by the bottom closure elevating device 13 to carry the articles to be treated in or out of the pressure vessel 3. Further, the bottom closure moving frame 11 is again moved in a horizontal direction and opposite to the pressure vessel 3 by the bottom closure moving device 17, the bottom closure elevating frame 12 is moved upward by the bottom closure elevating device 13 to move the cassettes to a position near a wafer handling unit 14, and the articles to be treated are supplied to or removed from the cassettes by the handling unit (robot) 14. The press frame 1 is again returned to the pressure vessel 3. The provision of the apparatus constitution capable repeating such a control as described enables continuous annealing of the plurality of articles to be treated every lot. In FIGS. 5 and 7, reference numeral 32 denotes a temporary deposit station, which is provided opposite to the robot 14 on the vessel frame 6.

In case of LSI semiconductors or like assumed to be articles to be treated, in the stage of treat, when dust or the like is adhered, a normal operation as an electric circuit is not assured. Therefore, it is desired ideally that treatment be done under the environment entirely free from dust, many of high-temperature and high-pressure treatment devices are installed in a clean room. It is not desirable that a single apparatus occupies a large space within a clean room having a limited volume, and a demand for miniaturization of apparatus is extremely high.

On the other hand, in case of the high-temperature and high-pressure treatment devices as described above, a region of a portion where the press frame 1 and the others move from a part at which the pressure vessel 3 is positioned, and a region of a portion where the bottom closure elevating frame 12 and others move in a reverse direction are necessary in terms of constitution of apparatus, thus posing a problem that a considerably large space is required for purpose of installation.

Further, in the conventional art shown in FIGS. 5 to 8, since the (reciprocating) movement of the press frame 1 and the (reciprocating) movement of the bottom closure moving frame 11 are respectively independent, there were a problem that an occasion of occurrence of dust caused by the aforesaid movement increases to somewhat lower the treatment under the environment free from dust, and a problem in terms of productivity resulting from a loss of time caused by the independent (individual) movement.

SUMMARY OF THE INVENTION

It is an object of the present invention to provide a high-temperature and high-pressure treatment device for the articles to be treated which attains compactness of the whole apparatus while enabling transfer for articles to be treated such as wafers of LSI semiconductors in the stable attitude.

The present invention relates to a high-temperature and high-pressure treatment device having a function of annealing articles to be treated such as LSI semiconductors (articles, particularly sheet articles), typically Si wafers, under an atmosphere of high-temperature and high-pressure gases within a pressure vessel, and a further function of sequentially carrying the articles to be treated in or out of the pressure vessel in order to continuously apply annealing to the articles to be treated, said treatment device providing the following technical means for achieving the aforementioned object. That is, the high-temperature and high-pressure treatment device according to the present invention comprises a module for carrying articles to be treated for carrying said articles to be treated in and out of a pressure vessel, and a press frame module for holding said pressure vessel in an axial direction of vessel when said articles to be treated are subjected to high-temperature and high-pressure treatment in said pressure vessel closed by top and bottom closures, characterized in that said module for carrying articles to be treated and said press frame module are connected and fixed so that both the modules can be reciprocated integrally.

By the provision of the constitution as described, a driving source for the module for carrying articles to be treated, and one corresponding to the bottom closure moving device 17 in the prior art, and a controller for controlling thereof are not necessary, thus achieving compactness of the entire apparatus; and the module for carrying articles to be treated and the press frame module can be reciprocated integrally, whereby not only occurrence of dust caused by movement is suppressed, but also the moving time is not wasteful.

The high-temperature and high-pressure treatment device according to the present invention further comprises, in addition to the above-described constitution, rail members extending on a horizontal surface parallel to each other at a position sandwiching said pressure vessel therebetween, said module for carrying articles to be treated and said press frame module capable of being reciprocated integrally in a longitudinal direction of said rail members.

By the provision of the constitution as described, instability of articles to be treated due to a cantilever mechanism in prior art, and inconveniences such as deflection and deviation can be overcome, and the rail members can be used in common whereby compactness becomes enabled.

Further, the high-temperature and high-pressure treatment device according to the present invention in the above-described constitution provides an arrangement wherein the connected and fixed portion of said module for carrying articles to be treated and said press frame module is a carriage portion.

By the arrangement wherein the connected and fixed portion of said module for carrying articles to be treated and said press frame module is a carriage portion, the connecting and fixing are easy and positive, and stability during carrying (during moving) is enhanced.

Further, in the present invention, said module for carrying articles to be treated is provided with carrying means for reciprocating the articles to be treated in an axial direction of the pressure vessel.

BRIEF DESCRIPTION OF THE DRAWINGS

FIGS. 4A and 4B are comparative plan views of the high-temperature and high-pressure treatment device, in which FIG. 4B is a plan view of the high-temperature and high-pressure treatment device according to the present invention and FIG. 4A is a plan view of the conventional high-temperature and high-pressure treatment device;

DESCRIPTION OF THE PREFERRED EMBODIMENTS

Figure 1:
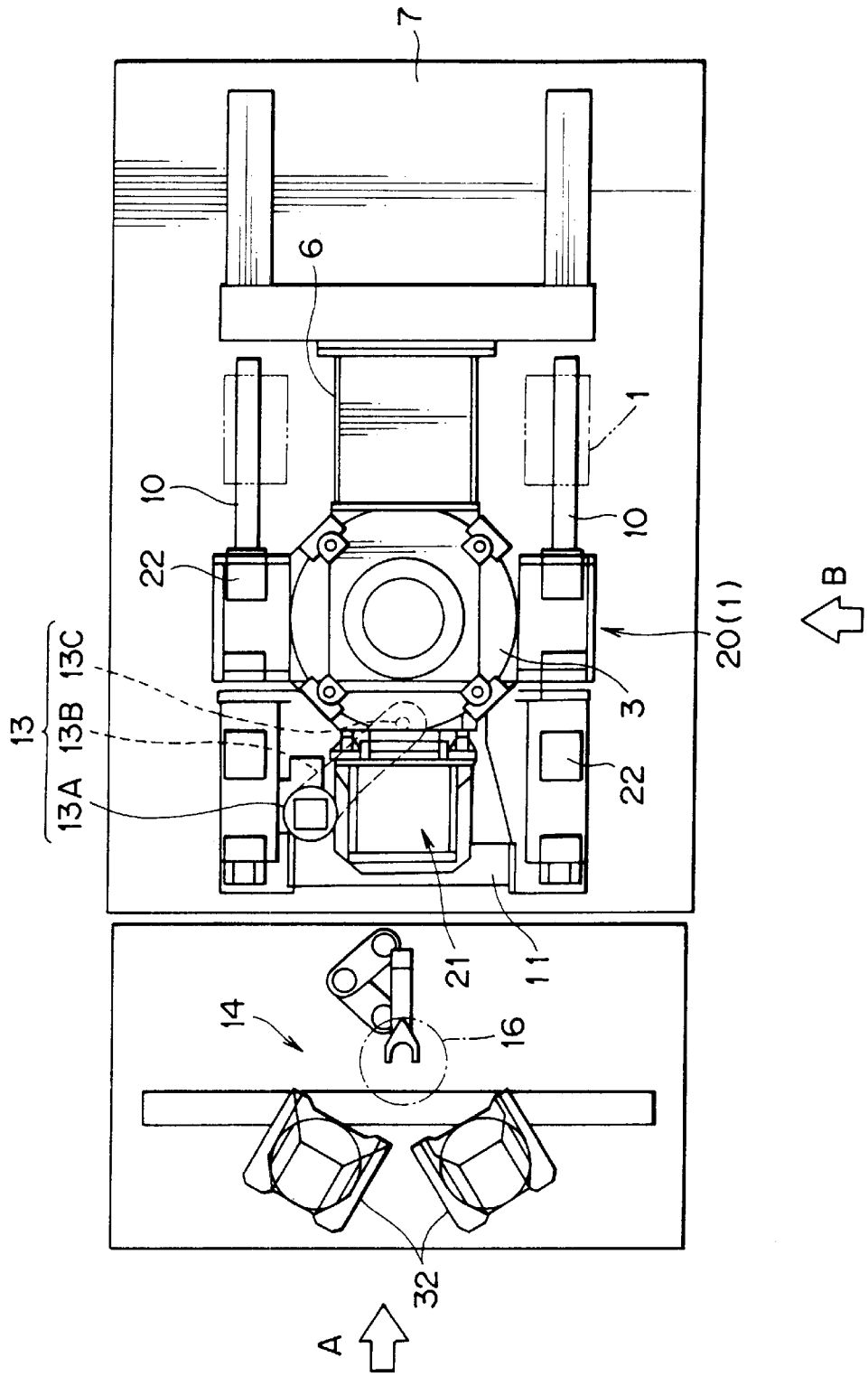
FIG. 1 is a top view of the entire apparatus showing an embodiment of a high-temperature and high-pressure treatment device according to the present invention.

In the following, the high-temperature and high-pressure treatment device according to the present invention will be described, in which the parts common to those of the prior art described previously are indicated by the same reference numerals.

Figure 2:
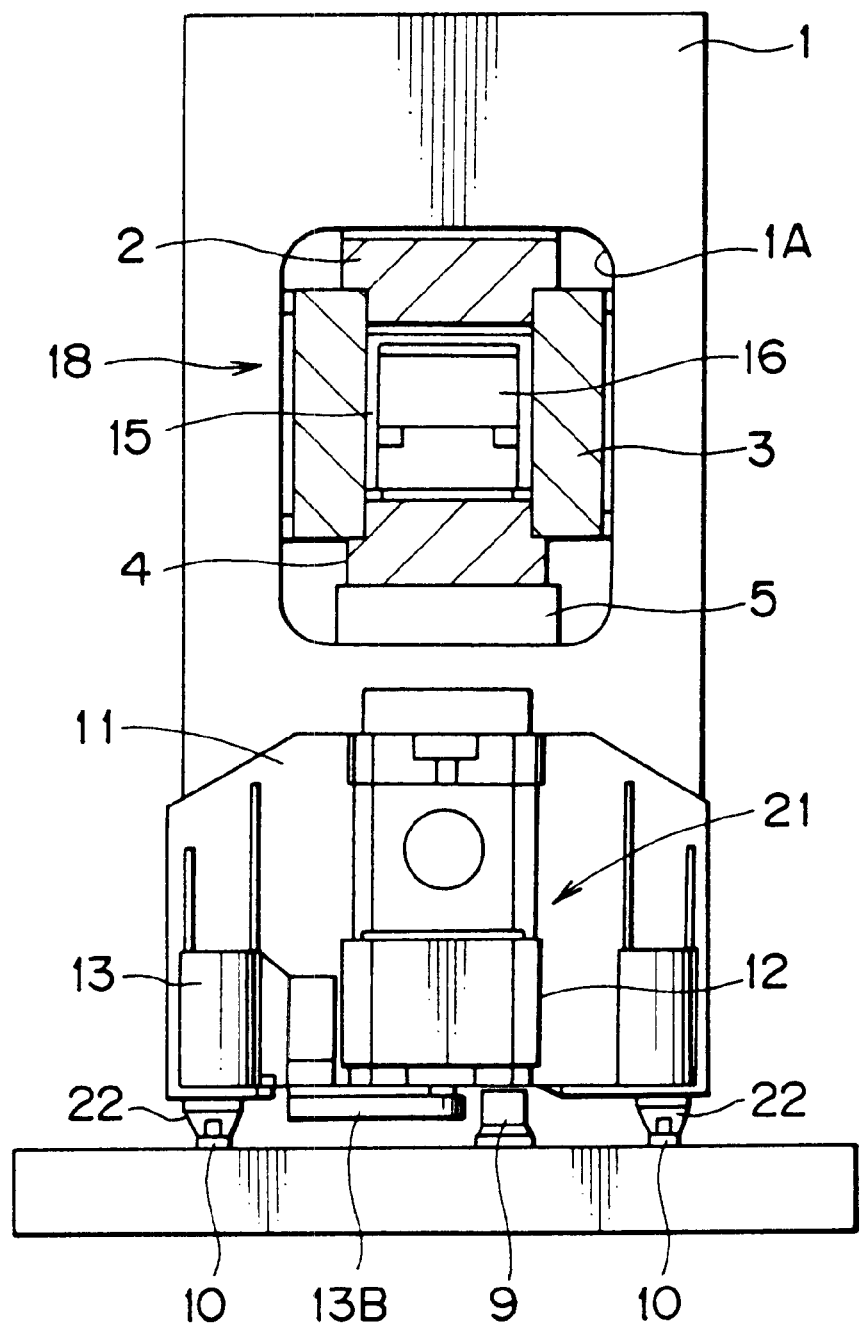
FIG. 2 is a view taken along arrow A in FIG. 1. (A first side view of the high-temperature and high-pressure treatment device according to the present invention.)
Figure 3:
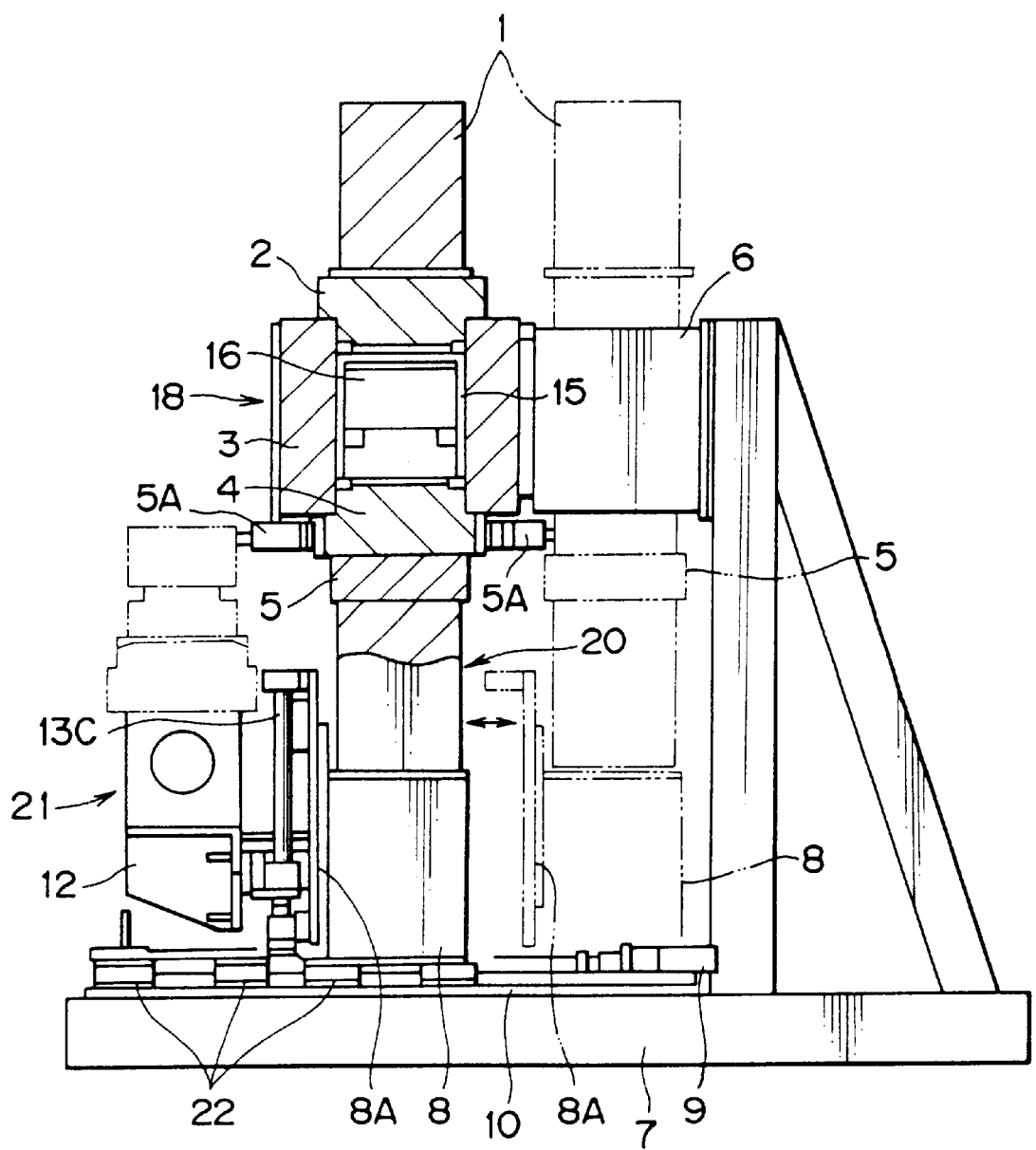
FIG. 3 is a view taken along arrow B in FIG. 1 (A second side view of the high-temperature and high-pressure treatment device according to the present invention.)

FIGS. 1 to 3 show one embodiment of a high-temperature and high-pressure treatment device according to the present invention, which does not limit the present invention. FIG. 1 is a top view (a plan view) of the entire apparatus of the high-temperature and high-pressure treatment device according to the present invention; FIG. 2 is a view taken along arrow A in FIG. 1; and FIG. 3 is a view taken along arrow B in FIG. 1.

The high-temperature and high-pressure treatment device shown in FIGS. 1 to 3 comprises a pressure vessel 3, a top closure 2, a bottom closure 4, a press frame 1 and the like. A constitution participated in annealing process and a pressing and treating module 18 have the same constitution as that of prior art. In the pressure vessel 3 constituting the pressing and treating module 18, the closures (the top closure 2, the bottom closure 4) are fitted in both ends in an axial direction of vessel to thereby define a pressing treatment chamber therein, the pressing treatment chamber being formed with a pressure oven provided with a heating element 15 such as a heater so that articles to be treated introduced into the pressing treatment chamber can be pressed and treated by isostatic pressure of inert gases such as argon and nitrogen while heating the articles to be treated.

The pressure vessel 3 is connected and fixed to a vessel frame 6 with the diametrically central part of vessel directed vertically. The vessel frame 6 is connected and fixed to a base frame 7 laid below the entire apparatus, and the pressure vessel 3 is supported on the base frame 7 and the vessel frame 6 in a cantilever fashion with the axial direction of vessel directed longitudinally (vertically). The pressure vessel 3 is constituted to be cylindrical, and the bottom closure 4 and the top closure 2 are disposed below and above, respectively, thereof.

The base frame 7 is provided with a rail construction in which a carriage or the like can be slid or rolled on the upper surface thereof. A carriage 8 is arranged on the base frame 7, the carriage 8 capable of being moved along the lengthwise of the base frame.

The press frame 1 is stood upright on the carriage 8, and the carriage 8 and the press frame 1 constitute a press frame module 20. The press frame 1 is as shown in FIG. 2, which is provided internally with a generally rectangular parallelepiped space portion 1A. Where the pressure vessel 3 is in a state closed by the top closure 2 and the bottom closure 4 and is not internally held at high pressure, the space portion is formed to have the size to such an extent that a slight gap is formed in the vertical direction thereof, so that when the pressure vessel 3 is in the aforesaid state, even if the carriage 8 on which the press frame 1 is stood upright is moved, the pressure vessel 3 or the top closure 2 and the bottom closure 4 are free from interference with the press frame 1, and the press frame 1 can be detached easily.

The press frame 1 causes the pressure vessel 3 to move to a position for receiving it in the space portion thereof before the articles to be treated are subjected to high-temperature and high-pressure treatment. The pressure vessel 3 is filled with a gas atmosphere at extremely high pressure over 20 MPa. Then, a large force exerts on the top closure 2 and the bottom closure 4 disposed vertically of the pressure vessel 3 in a direction of opening them (in an axial direction of vessel), and they move slightly toward that direction, but sealing is held by a seal member provided in a fitting portion between the top closure 2 and the bottom closure 4, and the pressure vessel 3 to maintain the internal closed state of the pressure vessel 3 for preventing the press frame 1 from gripping in the vertical direction (in the axial direction of vessel) and the top closure 2 and the bottom closure 4 from opening.

Articles to be treated in the form of a wafer are handled as one lot in the state of being received in a cassette 16 and stacked in plural number, similarly to prior art. In case of ULSI, articles to be treated are formed from a wafer of 200 mm (8 inch) in a standard. In this embodiment, in the form that about 25 wafers are stacked in the cassette, the 25 are handled as one lot. Since a plurality of articles to be treated per lot are carried, a bottom closure elevating frame 12, a bottom closure elevating device 13 and a bottom closure moving frame 11 are provide as a module for carrying articles to be treated 21, the bottom closure elevating device 13 serving as carrying means for reciprocating the articles to be treated in the direction of pressure vessel.

The module for carrying articles to be treated 21 is connected and fixed to the carriage 8 on which the press frame 1 is stood upright, and the module for carrying articles to be treated 21 and the press frame 1 are to be moved integrally as the carriage moves. More specifically, the bottom closure frame 11 is connected to the carriage 8 in a direction extending vertically by means of a detachable connecting device such as bolts and nuts or welding, numeral 8A showing a connecting and fixing part, and to the bottom closure moving frame 11 is connected to the bottom closure elevating frame 12 through the bottom closure elevating device 13 comprising an actuator 13A such as a motor, a winding transmission member 13B such as a belt, and an elevating member 13C such as a ball screw to constitute the module for carrying articles to be treated 21.

Where articles to be treated are carried in or out of the pressure vessel 3, first, the press frame 1 stood upright on the carriage 8 is linearly moved in a horizontal direction on the basis of control of a carriage moving device 9 such as an electric motor, a fluid cylinder or the like to secure a sufficient space below the pressure vessel 3 (see the imaginary line in FIG. 3). Subsequently, the bottom closure elevating frame 12 assumes a position of the space, that is, a position below the pressure vessel 3. Then the bottom closure elevating frame 12 is moved down by the bottom closure elevating device 13 to carry the articles to be treated in or out of the pressure vessel 3. Further, again, the entire module for carrying articles to be treated 21 is moved together with the press frame 1 in a horizontal direction and oppose to the pressure vessel 3 by the carriage 8, the bottom closure elevating frame 12 is moved up by the bottom closure elevating device 13, the cassette is moved close to a wafer handling unit (a handling robot) 14, and the articles to be treated are supplied to or removed from the cassette by the robot 14. Further the press frame 1 is again returned toward the pressure vessel 3. By the provision of apparatus constitution capable of repeating such a control as described, a plurality of articles to be treated per lot can be continuously subjected to annealing.

Figure 5:
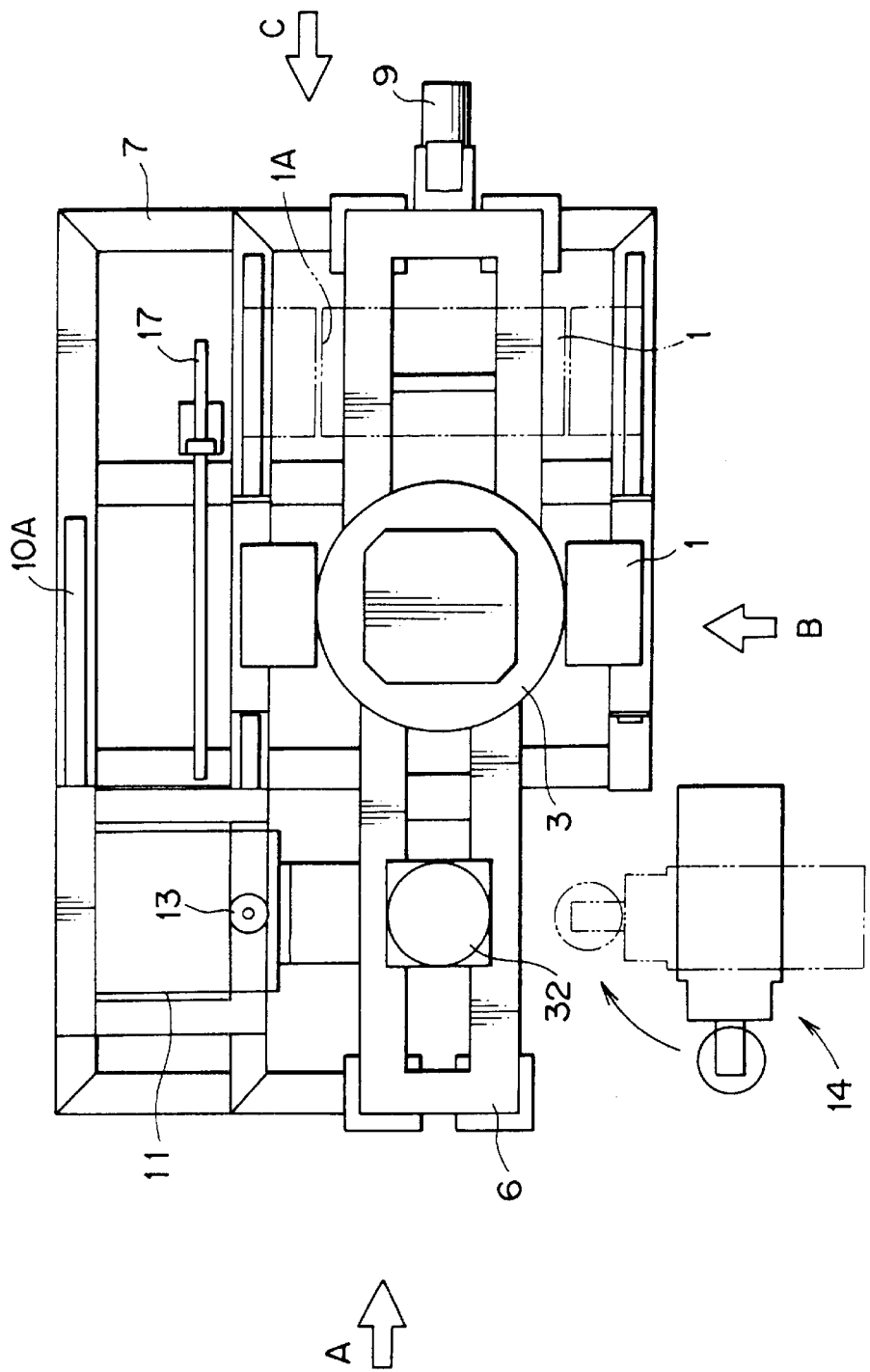
FIG. 5 is a top view of the entire constitution of the conventional high-temperature and high-pressure treatment device.

As described above, the module for carrying articles to be treated 21 and the press frame 1 are connected and fixed to a common member, that is, the carriage 8, and constituted to be reciprocated integrally. By the constitution as described, both the module for carrying articles to be treated 21 and the press frame 1 can be driven by one and the same driving source. Conventionally, the module for carrying articles to be treated 21 and the press frame 1 are moved separately, and therefore, referring to FIG. 5, the bottom closure moving device 17 is provided along the lengthwise widewise of the module for carrying articles to be treated, whereas in the high-temperature and high-pressure treatment device according to the present invention, the device 17 is not required. Referring to FIGS. 1 to 3, the module for carrying articles to be treated 21 and the press frame 1 are to exert the force on the carriage 8 connected and fixed below thereof by the driving source, the carriage moving device 9, and can be linearly reciprocated lengthwise of rails through a linear 22 on rail members 10. It is noted that the carriage moving device 9 as a driving source is preferably formed from a member that can be applied under a clean environment possibly free from dust or the like an electric motor, and the linear 22 which slides or rolls on the rail members 10 is also preferably formed from a member having a needle bearing or the like and free from dust.

Figure 4A:
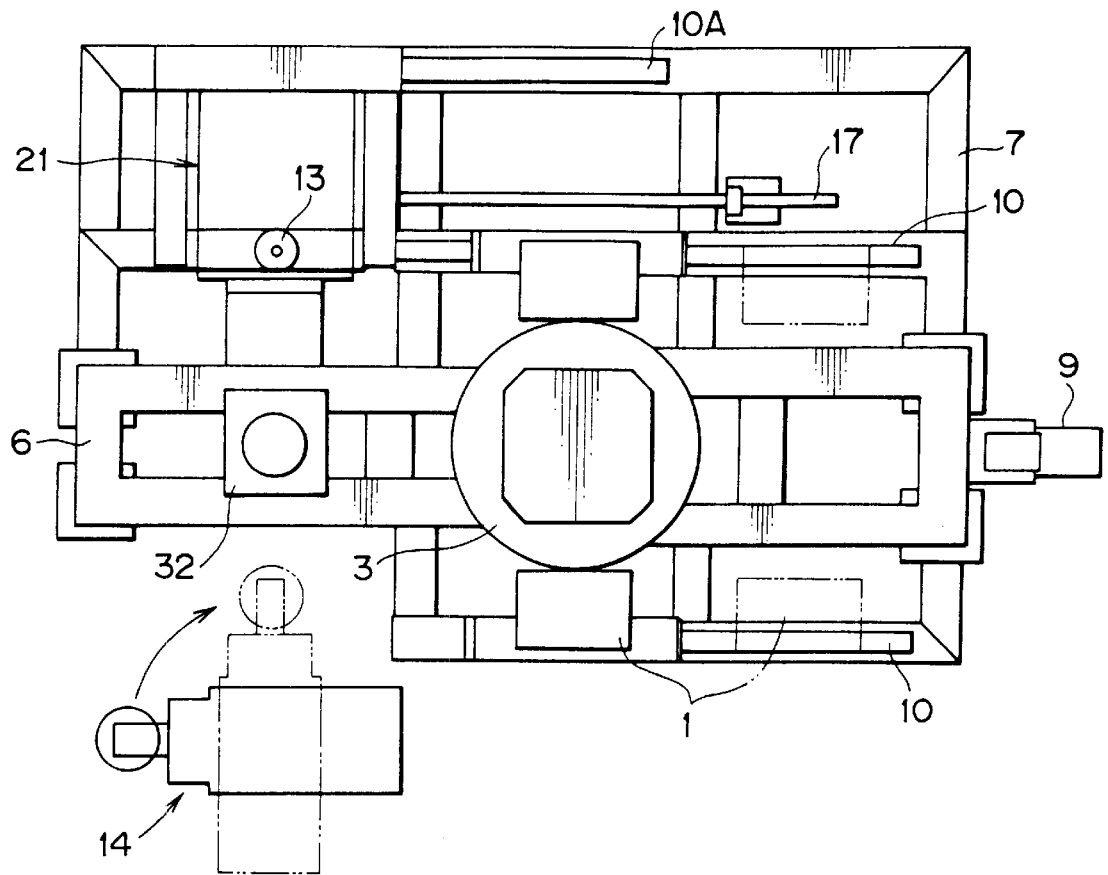
Figure 4B:
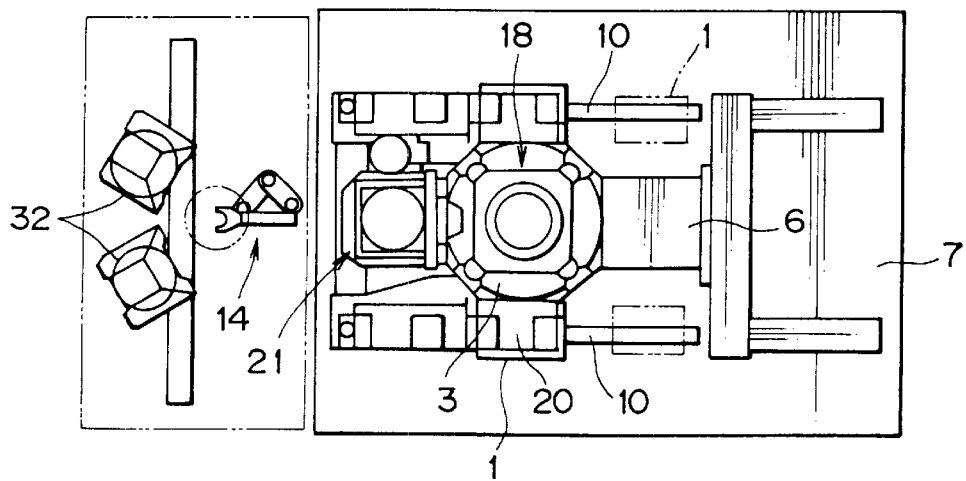

Since as described above, the member corresponding to the bottom closure moving device 17 as a driving source for the module for carrying articles to be treated in the prior art is not required, naturally, compactness of the entire apparatus for a region portion conventionally occupied by the constitution can be achieved. With the single driving source, a control device not shown for controlling the former can be unified to make the apparatus constitution simple, this achieving compactness also. FIGS. 4A and 4B are comparative plan views in a reduced scale of the high-temperature and high-pressure treatment device according to the present invention and the conventional high-temperature and high-pressure treatment device.

Figure 6:
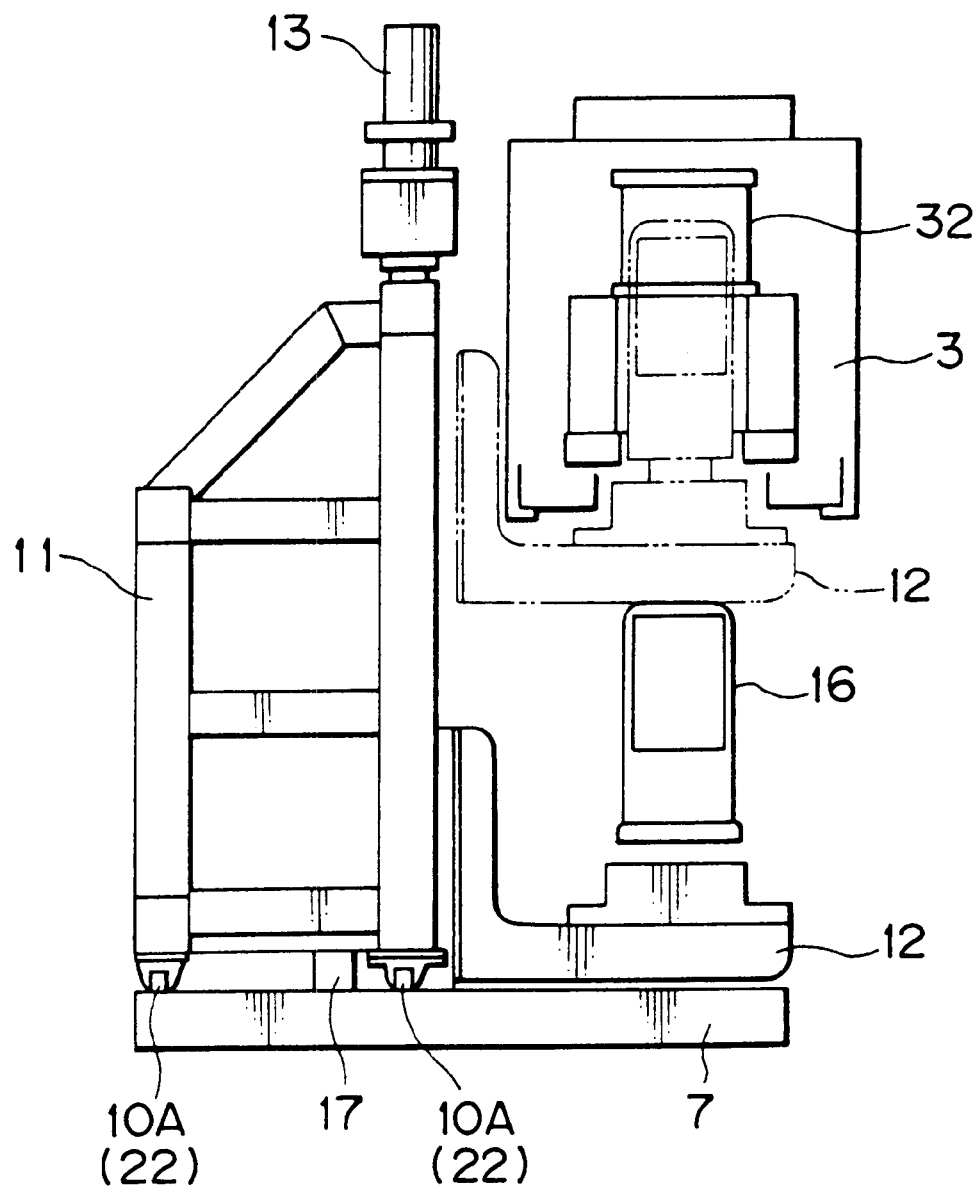
FIG. 6 is a view taken along arrow A in FIG. 5. (A first side view of the conventional high-temperature and high-pressure treatment device.)
Figure 7:
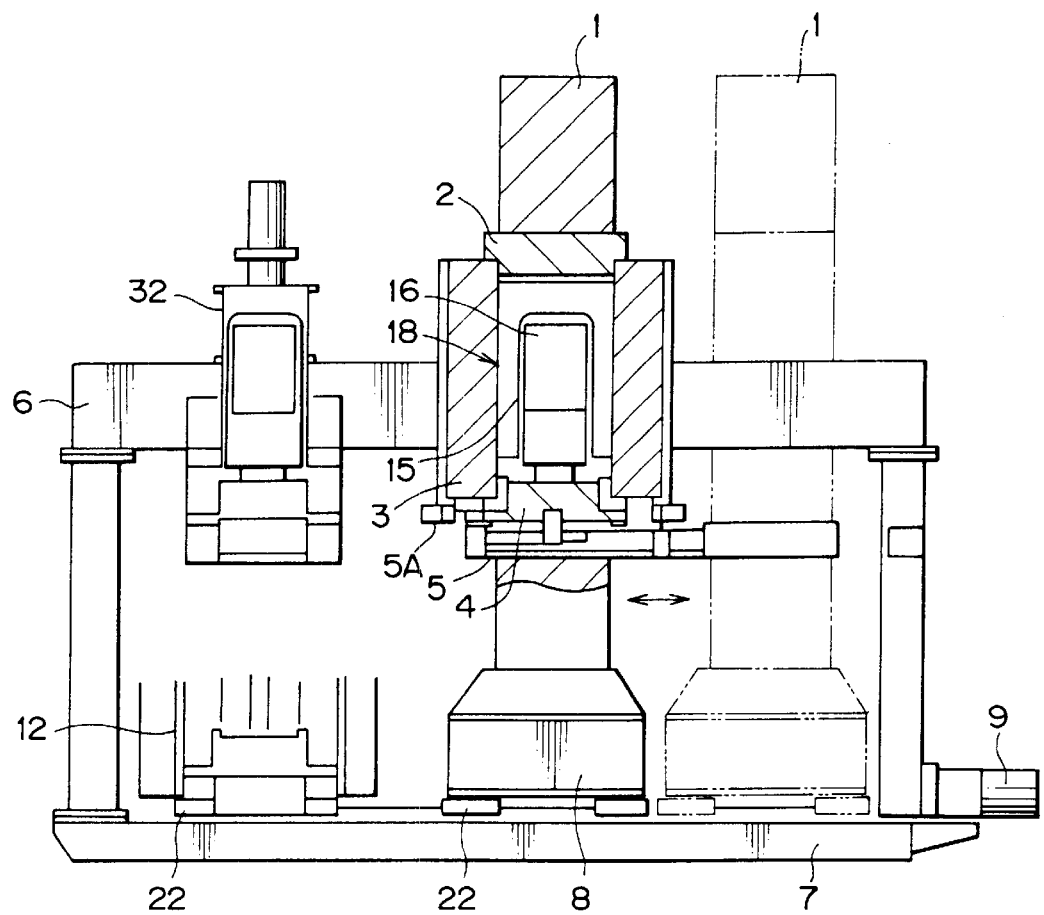
FIG. 7 is a view taken along arrow B in FIG. 5 (A second side view of the conventional high-temperature and high-pressure treatment device.)
Figure 8:
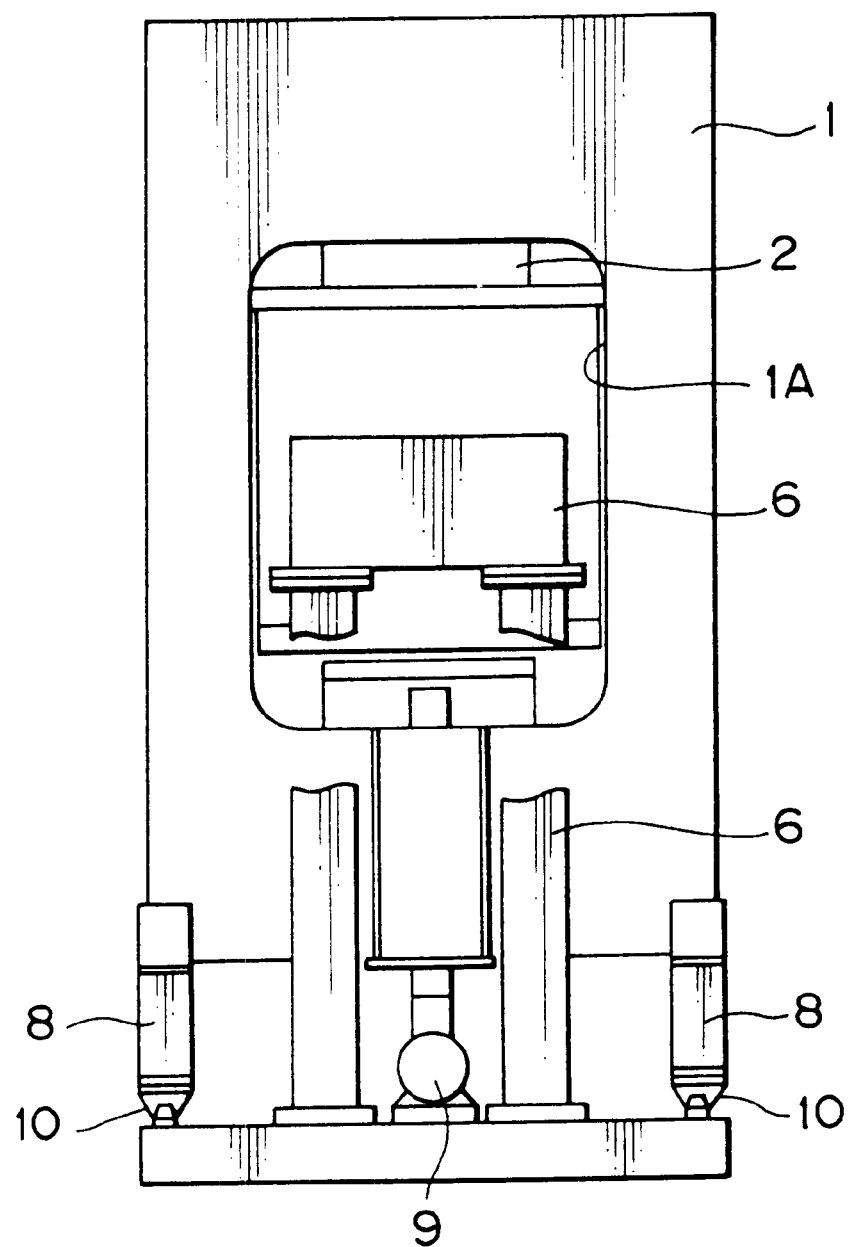
FIG. 8 is a view taken along arrow C in FIG. 5 (A third side view of the conventional high-temperature and high-pressure treatment device.).

Two rail members 10 extending parallel to each other and in a horizontal direction are included in the upper surface of the base frame 7, and the module for carrying articles to be treated and the press frame 1 together with the pressure vessel 3 are disposed in the form sandwiched between the rail members. That is, the module for carrying articles to be treated and the press frame 1 can be integrally reciprocated along the rail member and in the form sandwiched between the rail members. In prior art, as shown in FIG. 6, the module for carrying articles to be treated has the bottom closure elevating frame 12 supported in a cantilever fashion, in such a constitution of which, the articles to be treated are sometimes not stable during carrying, but in the present invention, the bottom closure elevating frame 12 can be supported in a center fashion through the two rail members 10 through a carriage portion, the articles to be treated during carrying can be made stable, the rail members 10 can be used in common with respect to both the modules 20 and 21 whereby contributing to compactness of the entire apparatus; and further, both the modules 20 and 21 are not moved separately (independently) but reciprocated integrally whereby not only occurrence of dust caused by friction or the like resulting from movement can be suppressed but also the movement is not wasteful to enable enhancement of productivity.

In FIGS. 1 to 8, numeral 5 designates a pressure resisting plate, 5A a bottom closure holding member, and 22 the linear (a sliding member, a rolling member) which is supported on the rail members 10, 10A for movement.

The form for carrying out the present invention is as described above, but the following modifications can be employed:

(1) The pressure vessel is installed laterally (an axial direction of vessel to a horizontal direction.
(2) With respect to the pressure vessel, its closure is made to be fittable on the charge and removing (carrying in and out) side with respect to the pressure vessel, while other closure is made integral with a vessel, that is, to be a closed-end pressure vessel.
(3) The connecting and fixing portion of the press frame module and the module for carrying articles to be treated are done other than the carriage portion. It is noted that by connecting and fixing at the carriage portion, connection of both the modules is easy and positive, and not only maintenance of both the parts is improved but also stability during reciprocating movement is also enhanced.

As described above, according to the present invention, despite that articles to be treated can be continuously subjected to annealing, the entire apparatus can be installed in compact whereby suppression of dust in a clean room can be achieved and productivity can be also enhanced.

What is claimed is:

1. A high-temperature and high-pressure treatment device comprising:

a pressure vessel, a module for carrying articles to be treated in and out of said pressure vessel, and a press frame module shaped to enclose and hold said pressure vessel in an axial direction of the vessel to prevent top and bottom closures from opening when said articles to be treated are subjected to high-temperature and high-pressure treatment in said pressure vessel closed by top and bottom closures, wherein said module for carrying said articles to be treated and said press frame module are connected and fixed so that both the modules can be reciprocated integrally.

2. The high-temperature and high-pressure treatment device according to claim 1, further comprising rail members extended on a horizontal surface parallel to each other at a position sandwiching said pressure vessel therebetween, said module for carrying articles to be treated and said press frame module capable of being reciprocated integrally in a longitudinal direction of said rail members.

3. The high-temperature and high-pressure treatment device according to claim 1, wherein the connected and fixed portion of said module for carrying articles to be treated and said press frame module is a carriage portion.

4. The high-temperature and high-pressure treatment device according to claim 1, wherein said module for carrying articles to be treated is provided with carrying means for reciprocating the articles to be treated in an axial direction of the pressure vessel.

* * * * *